United States Patent
Stutz

[11] Patent Number: 6,127,280
[45] Date of Patent: Oct. 3, 2000

[54] PHOTOELECTROCHEMICAL CAPACITANCE-VOLTAGE MEASUREMENTS OF WIDE BANDGAP SEMICONDUCTORS

[75] Inventor: Charles E. Stutz, Lewisburg, Ohio

[73] Assignee: The United States of America as represented by the Secretary of the Air Force, Washington, D.C.

[21] Appl. No.: 09/263,562

[22] Filed: Mar. 8, 1999

Related U.S. Application Data

[60] Provisional application No. 60/087,369, May 26, 1998.

[51] Int. Cl.$^7$ .................................................. H01L 21/302
[52] U.S. Cl. ........................ 438/746; 438/747; 438/750; 438/753
[58] Field of Search ................................ 438/7, 745, 746, 438/750, 753, 747, 16

[56] References Cited

U.S. PATENT DOCUMENTS

| | | | |
|---|---|---|---|
| 4,168,212 | 9/1979 | Faktor et al. | 205/790.5 |
| 5,065,103 | 11/1991 | Slinkman et al. | 324/458 |
| 5,200,693 | 4/1993 | Singletery, Jr. | 324/767 |
| 5,580,828 | 12/1996 | Ferenczi et al. | 438/16 |

OTHER PUBLICATIONS

"Electrochemical CV Profiling of Group III—Nitrides" *Compound Semiconductor* May 23, 1997.

*Primary Examiner*—Benjamin L. Utech
*Assistant Examiner*—Binh X. Tran
*Attorney, Agent, or Firm*—Richard A. Lambert; Bobby D. Scearce; Thomas L. Kundert

[57] ABSTRACT

A method of determining the carrier concentration depth profile in n-type wide bandgap semiconductor wafers is disclosed. The method includes placing a semiconductor wafer within a photoelectrochemical capacitance-voltage measurement system, in contact with a Schottky electrolyte solution. A high energy ultraviolet light is directed through the electrolyte solution to impinge upon the surface of the semiconductor wafer. The ultraviolet light has an energy greater than the energy bandgap of the semiconductor material and thus facilitates reliable etching thereof. The etch is allowed to continue until a desired depth in the sample is obtained. Upon cessation of the etch, the carrier concentration is determined. The steps of determining the carrier concentration and etching are repeated until the desired carrier concentration depth profile has been obtained.

12 Claims, 2 Drawing Sheets

PHOTOELECTROCHEMICAL CAPACITANCE-VOLTAGE MEASUREMENTS OF WIDE BANDGAP SEMICONDUCTORS

The present application is related to and claims priority on prior provisional Application No. 60/087,369, filed May 26, 1998, entitled PHOTOELECTROCHEMICAL CAPACITANCE VOLTAGE MEASUREMENTS OF WIDE BANDGAP SEMICONDUCTORS.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to methods of testing semiconductor devices, and more specifically to a method of determining the carrier concentration depth profile of wide bandgap semiconductors using photoelectrochemical capacitance-voltage measurements.

Testing a wafer sample in order to determine carrier concentration depth profiles using a capacitance-voltage (C-V) technique is well known. This technique includes placing a metal Schottky contact on the sample to be measured and applying a voltage such that a depletion region (region of no carriers) is manifested under the Schottky. Increasing the voltage causes the front of the depletion region to move. At each voltage, a capacitance measurement is made which is used with mathematical manipulation to determine a carrier concentration at an associated depth from the Schottky contact. A shortcoming of this method is that the material being measured can accept only a limited amount of applied voltage before the electric field becomes so high it goes into a breakdown mode. When breakdown occurs the measurement cannot be made. The depth of most materials used for devices is much deeper than can be probed using this technique.

One improved variation on the C-V technique includes etching a sample to a certain depth with a liquid electrolyte that doubles as a Schottky and then making the C-V measurement at each etch point. This method needs to be computer controlled so that the system takes a C-V measurement, then etches to a predetermined depth, then takes another C-V measurement, so that the system cycles down through the material. This allows one to see the carrier depth profile down to an unlimited depth by negating the problem of voltage breakdown.

In order to prevent uncontrolled etching, a photoelectrochemical method was developed so that the Schottky electrolyte would only etch the material when it is exposed to a light source whose energy was larger than the energy bandgap of the material being measured. In the past, this method has been limited to materials with energy bandgaps of about 1.5 eV or less at room temperature.

It is known that wide bandgap semiconductors, by their very nature, are quite promising at high temperatures and recently, much effort has been expended in the development of widebandgap semiconductor materials such as gallium nitride for use in high temperature transistors and blue lasers.

But, a significant problem in the widespread, commercial utilization of wide bandgap materials such as gallium nitride or silicon carbide is the aforesaid 1.5 eV bandgap limitation. More specifically, the 1.5 eV bandgap of the known photoelectrochemical capacitance-voltage method is insufficient to reliably etch wide bandgap materials.

A need exists therefore for an improved photoelectrochemical capacitance-voltage measurement method. Such a method would be useful for reliably determining carrier concentration profiles in wide bandgap semiconductor materials such as gallium nitride and silicon carbide.

It is therefore a primary object of the present invention to provide a method of making photoelectrochemical capacitance-voltage measurements of wide bandgap semiconductors overcoming the limitations and disadvantages of the prior art.

It is another object of the present invention to provide a method of making photoelectrochemical capacitance-voltage measurements providing an accurate carrier concentration depth profile in wide bandgap semiconductor materials.

These and other objects of the invention will become apparent as the description of the representative embodiments proceeds.

SUMMARY OF THE INVENTION

In accordance with the foregoing principles and objects of the invention, a method of making photoelectrochemical capacitance-voltage measurements of wide bandgap semiconductors is described.

In the preferred embodiment, the method of the present invention includes placing a semiconductor wafer in the test cell of a photoelectrochemical capacitance-voltage measurement system. Photoelectrochemical capacitance-voltage measurement systems are known in the art and are commercially available.

A 0.05 M electrolyte solution of potassium hydroxide is placed in contact with the wafer. This electrolyte solution performs the dual function of etching the surface at a controlled rate as well as providing the Schottky barrier contact suitable for measurement of carrier concentration.

Advantageously and according to an important aspect of the present invention, the quartz halogen light source of the typical photoelectrochemical capacitance-voltage system has been replaced with a high energy ultra-violet (UV) light source. The UV light has a much higher energy bandgap than the quartz halogen standard and is therefore suitable for etching wide bandgap semiconductor materials. In the preferred embodiment, the UV light source is a high energy mercury lamp. Other sources of UV light such as a UV laser, deuterium lamp or Xenon lamp also provide satisfactory results, at higher power levels.

According to the method of the present invention, the UV light is directed through a lens arrangement to the electrolyte solution to impinge upon the surface of the semiconductor wafer. The combination of the high energy UV light and the potassium hydroxide electrolyte solution etches the surface of the wafer at room temperature. The etch is allowed to continue for a time sufficient to etch the wafer to a predetermined depth. When the desired depth is obtained, the carrier concentration is measured. The impingement of the light is controlled by the operation of a shutter.

The steps of etching the wafer and determining the carrier concentration are repeated until the carrier concentration throughout the wafer is determined. In this manner, multiple carrier concentration steps can be seen and the carrier concentration depth profile can be reliably determined.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
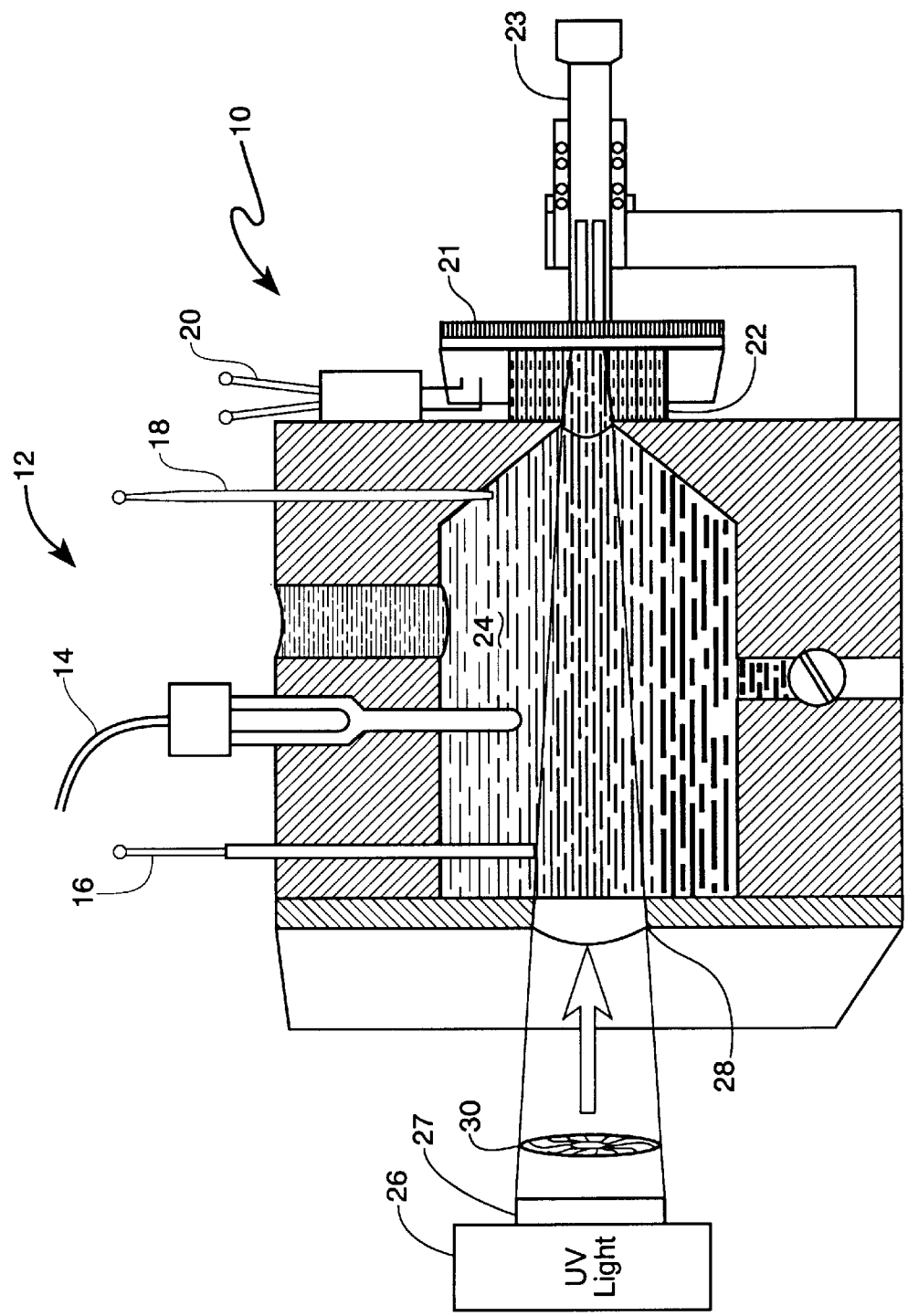
FIG. 1 is a sectional view of a photoelectrochemical capacitance-voltage test cell suitable for use in performing the method of the present invention.

Reference is now made to FIG. 1 showing a photoelectrochemical capacitance-voltage test cell 10 suitable for use in performing the method of the present invention. While photoelectrochemical capacitance-voltage test cells can be readily made for performing the steps of the present invention, one suitable commercial test apparatus is the Bio-Rad 4200 ECV Profiler available from Bio-Rad Laboratories.

As shown, the cell 10 includes a set of electrodes 12 for performing the carrier concentration depth profile analysis. As will be described in more detail below, the direct current measured through the cell is utilized to provide an indication of the etch depth. The depletion depth and carrier concentration analyses are determined as a result of measurements of capacitance upon application of a modulated or AC voltage within the cell.

Pursuant to the above, the electrodes 12 include a saturated calomel electrode 14 to provide a voltage reference value. A counter electrode 16 is utilized as a current collector. A platinum electrode 18 is utilized to provide AC signals into the cell 10. A DC bias is provided to the sample electrode with respect to the calomel electrode 14 by electrodes 20. As is known in the art, these electrodes 20 can also provide a check for good sample surface contact.

A wafer sample 21 is sealed to the test cell 10 via a sealing ring 22. A spring loaded plunger 23 may be utilized in order to urge the sample 21 against the sealing ring in order to enhance sealing. An electrolyte solution 24 is placed within the test cell 10. The electrolyte solution 24 performs the dual function of etching the surface at a controlled rate as well as providing the Schottky barrier contact suitable for measurement of carrier concentration. In the preferred embodiment of the present invention, the electrolyte solution 24 is a 0.05 M concentration of potassium hydroxide. Other electrolytic solutions can also be used such as sodium hydroxide or sulfuric acid.

According to an important aspect of the present invention, a small quantity of surfactant (not shown) is applied at the edges of the sealing ring 22 in order to reduce bubbling of the electrolyte solution 24 during etch. An example of a surfactant providing satisfactory results is Triton X-100, available from Sigma-Aldrich, St. Louis, Mo.

Applying the surfactant only to the edges of the sealing ring eliminates the possibility of contaminating the electrolyte solution 24 while maximizing the effectiveness of the etch by eliminating undesirable bubbling.

Advantageously and according to another important aspect of the present invention, the standard quartz-lamp of the photoelectrochemical capacitance-voltage systems known in the art has been replaced by an ultraviolet (UV) light source 26. It has been determined that UV light having a wavelength of 325 nanometers (energy of 3.8 eV) has sufficient energy to etch the widebandgap semiconductor materials such as gallium nitride and silicon carbide. The preferred diameter of the light source is 1–3 mm. In the preferred embodiment, the UV light source 26 having the desirable high energy characteristics is a mercury lamp. It is desirable to pass the light from the light source 26 through an optical filter 27. The filter 27 allows only UV light in the range of 280–400 nm to pass into the cell 10, onto the surface of the wafer sample 21. An example of a suitable filter 27 is Dichroic Mirror, Part Number 66216, available from Oriel Instruments, Stratford, Conn. Other sources of UV light such as a UV laser, deuterium lamp or Xenon lamp also provide satisfactory results, at high power levels. The power of the lamp depends, to a degree, upon the optical quality of the filter 27 as well as the cell window described below. However, it has been determined that power levels ranging from at least 100 Watts to 500 Watts or more, will provide satisfactory results. As can be appreciated, if a UV laser is used as the UV light source, the optical filter 27 is not required due to the coherent nature of laser light.

According to the method of the present invention, the UV light generated by the source 26, passes through the filter 27, through a Sapphire cell window 28, through the electrolyte solution 24, to impinge upon the surface of the semiconductor wafer sample 21. The application of the light is controlled by opening and closing a shutter 30. The combination of the high energy UV light and the potassium hydroxide electrolyte solution 24 etches the surface of the wafer at room temperature. The etch is allowed to continue for a time sufficient to etch the wafer to a predetermined depth.

The etch depth $W_e$ is the integration of the measured DC etch current over time $$W_e = \frac{M}{zF\rho A} \int I\,dt$$

where M is the molecular weight of the semiconductor, z is the semiconductor valence, (3 for GaN), F is the Faraday constant, $\rho$ is the density of the semiconductor, I is the measured etch current, and dt is an increment of time.

The carrier concentration is measured by the application of an AC signal and then mathematically manipulating the results obtained. This calculation modulates a small voltage <<1 V and uses the following equations to determine a depletion depth Wd and carrier concentration N:

$$W_d = \frac{\varepsilon A}{C_m},$$

$$N = \frac{C_m^3}{q\varepsilon A^2 \frac{dC_m}{dV}},$$

where the dielectric constant $\varepsilon=9.5*\varepsilon_0$ for GaN, A is the Schottky area, $C_m$ is the measured capacitance, $q=1.6\times10^{-19}$, and V is the modulated voltage. The total depth in a profile is equal to the sum of $W_e+W_d$.

Figure 2:
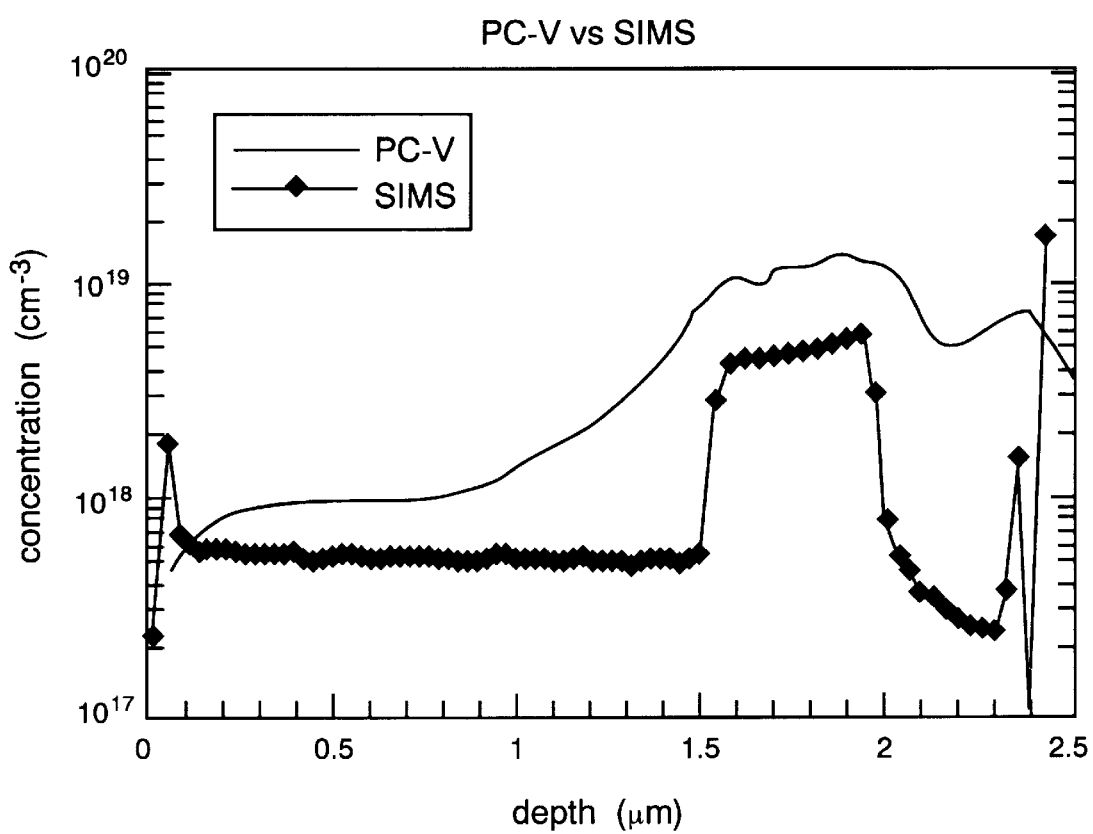
FIG. 2 is a graph illustrating the results of a carrier concentration versus depth profile of n-type GaN made according to the method of the present invention.

The steps of etching the wafer sample 21 and determining the carrier concentration are repeated until the carrier concentration throughout the wafer is determined. Plotting depth versus carrier concentration provides the desired carrier concentration depth profile. See, for example, FIG. 2 where a representative carrier concentration depth profile obtained from utilizing the steps of the present invention is shown. Note, further, the high correlation between the carrier concentration versus depth profile obtained by utilization of the method of the present invention versus that obtained by use of the secondary ion mass spectroscopy (SIMS) method. This shows the ability to determine multiple levels of concentrations.

In summary, numerous benefits have been described from employing the principles of the present invention. The method of measuring carrier concentration depth profile of the present invention advantageously can be used to reliably determine the carrier concentration characteristics of wide bandgap semiconductor materials. By substituting the standard quartz halogen light source with a high energy UV light source, sufficient energy can be imparted to the Schottky electrolyte solution so as to cause reliable etching of wide bandgap semiconductors.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

I claim:

1. A method of determining the carrier concentration depth profile in n-type wide bandgap semiconductor wafers, comprising the steps of:

providing a sealing ring;

applying a surfactant to said sealing ring;

placing said sealing ring upon the semiconductor wafer such that said surfactant contacts the semiconductor wafer;

sealing the semiconductor wafer within a photoelectrochemical capacitance-voltage measurement system;

contacting the semiconductor wafer with a Schottky electrolyte solution;

providing a high energy ultraviolet light source, said light source being directed into said photoelectrochemical capacitance-voltage measurement system;

filtering the ultraviolet light generated by said ultraviolet light source to provide ultraviolet light having a wavelength in the range of about 280–400 nanometers;

determining the carrier concentration;

etching said wafer to a depth by impinging said filtered ultraviolet light thereon; and, repeating said determining and etching steps until the carrier concentration depth profile has been obtained.

2. The method of claim 1 wherein said ultraviolet light source further includes a controllably operable shutter.

3. The method of claim 1 wherein said Schottky electrolyte solution is selected from the group consisting of potassium hydroxide, sodium hydroxide and sulfuric acid.

4. The method of claim 1 wherein Schottky electrolyte solution is about a 0.05 M solution of potassium hydroxide.

5. The method of claim 1 wherein said high energy ultraviolet light source is a mercury lamp.

6. The method of claim 1 wherein said high energy ultraviolet light source is a Xenon lamp.

7. The method of claim 1 wherein said high energy ultraviolet light source is a deuterium lamp.

8. A method of determining the carrier concentration depth profile in n-type wide bandgap semiconductor wafers, comprising the steps of:

providing a sealing ring;

applying a surfactant to said sealing ring;

placing said sealing ring upon the semiconductor wafer such that said surfactant contacts the semiconductor wafer;

sealing the semiconductor wafer within a photoelectrochemical capacitance-voltage measurement system;

contacting the semiconductor wafer with a Schottky electrolyte solution;

providing a high energy ultraviolet laser light source, said laser light source being directed into said photoelectrochemical capacitance-voltage measurement system;

determining the carrier concentration;

etching said wafer to a depth by impinging said ultraviolet laser light thereon; and, repeating said determining and etching steps until the carrier concentration depth profile has been obtained.

9. The method of claim 8 wherein said Schottky electrolyte solution is selected from the group consisting of potassium hydroxide, sodium hydroxide and sulfuric acid.

10. The method of claim 8 wherein Schottky electrolyte solution is about a 0.05 M solution of potassium hydroxide.

11. The method of claim 8 wherein said ultraviolet laser light has a wavelength of about 325 nanometers.

12. The method of claim 8 wherein said ultraviolet laser light source further includes a controllably operable shutter.

* * * * *